US006686762B2

(12) United States Patent
Leddige et al.

(10) Patent No.: US 6,686,762 B2
(45) Date of Patent: Feb. 3, 2004

(54) MEMORY MODULE USING DRAM PACKAGE TO MATCH CHANNEL IMPEDANCE

(75) Inventors: Michael W. Leddige, Beaverton, OR (US); James A. McCall, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 468 days.

(21) Appl. No.: 09/734,853

(22) Filed: Dec. 11, 2000

(65) Prior Publication Data

US 2002/0073273 A1 Jun. 13, 2002

(51) Int. Cl.$^7$ .................. H03K 17/16; H03K 19/003
(52) U.S. Cl. ................ 326/30; 711/105; 333/17.3
(58) Field of Search ................ 326/30; 365/189.01, 365/189.11; 333/17.03; 711/105

(56) References Cited

U.S. PATENT DOCUMENTS 5,945,886 A * 8/1999 Millar ................... 333/1
6,067,594 A   5/2000 Perino et al.
6,266,252 B1 * 7/2001 Karabatsos ............ 361/788
6,292,407 B1 * 9/2001 Porter et al. ......... 365/189.11
6,445,259 B1 * 9/2002 Thompson et al. ..... 333/17.3

FOREIGN PATENT DOCUMENTS

| JP | 06160493 A | * | 6/1994 |
| JP | 07074606 A | * | 3/1995 |
| JP | 11087656 A | * | 3/1999 |

* cited by examiner

Primary Examiner—B. James Peikari
(74) Attorney, Agent, or Firm—Blakely, Sokoloff, Taylor & Zafman LLP

(57) ABSTRACT

A memory module is described. That memory module includes a memory device and a signal trace that has an unloaded portion and a loaded portion. The loaded portion has a first section and a second section. The memory device includes an input connection and an output connection. The first section of the loaded portion of the signal trace is coupled to the input connection and the second section of the loaded portion of the signal trace is coupled to the output connection. The impedance of the loaded portion is higher than it would have been if the first and second sections had been coupled to the same memory device connection.

15 Claims, 2 Drawing Sheets

MEMORY MODULE USING DRAM PACKAGE TO MATCH CHANNEL IMPEDANCE

FIELD OF THE INVENTION

The present invention relates to memory modules, particularly those containing memory devices that transmit and receive high speed pipelined signals.

BACKGROUND OF THE INVENTION

Certain computer systems may employ a serial bus to transmit signals between a memory controller and memory. An example of such a serial bus has been defined by Rambus Corporation of Mountain View, Calif. That bus, often called the Direct Rambus memory channel, enables transmission of high speed, pipelined signals between a memory controller and memory. A memory card or module coupled to the bus may contain a number of high speed DRAMs, which have a Rambus developed architecture. Such memory devices are often called "Rambus DRAMs" or "RDRAMs."

The Direct Rambus memory channel requires signals to travel through all memory devices until terminated. Those memory devices add capacitance to the signal line, which lowers line impedance at those devices, when compared to the impedance of unloaded portions of the channel. That impedance discontinuity could adversely affect system performance, e.g., by requiring reduction in the maximum frequency at which high speed, pipelined electrical signals may be driven along the interconnect—to prevent signal reflection that may degrade signal quality.

To mitigate this effect, a design has been proposed in which the impedance of another portion of the signal line is raised to compensate for the reduced impedance at the memory devices. As shown in FIG. 1, which represents a printed circuit board ("PCB") that contains several memory devices, relatively short high impedance lines 1 may be placed between memory devices 2 and unloaded portions 3 and 4 of the signal trace. (Dashed box 5 serves to indicate that PCB 10 may include memory devices in addition to those shown, which may be mounted to both sides of PCB 10. PCB 10 may, for example, include 16 memory devices—8 on each side.) Line 1 may provide an effective impedance of about 45 to 65 ohms. By adjusting the length of lines 1, the average impedance resulting from the combination of lines 1 and memory devices 2 (which constitutes the loaded portion of the channel) can closely match the impedance of the unloaded portions of the channel (e.g., unloaded portions 3 and 4 on PCB 10 and unloaded portions that are located on a motherboard designed to receive PCB 10). When the average impedance that results from combining lines 1 and memory devices 2 is approximately equal to that of the unloaded portions of the channel, (e.g., about 28 Ohms) the portion of the signal trace that lies between points 6 and 7 (i.e., the loaded portion of the channel) may, for all practical purposes, be treated as an extension of unloaded portions 3 and 4.

Because PCB 10 includes a trace that has relatively thin and relatively thick sections, PCB 10 requires that two impedance specifications be met—one for the high impedance portion of the trace (e.g., lines 1 of FIG. 1) and another for the unloaded portions of the trace (e.g., unloaded portions 3 and 4 of FIG. 1). Requiring a PCB to meet two different specifications for trace impedance may, however, increase cost and increase the amount of testing required to ensure that the PCB meets those specifications. In addition, requiring the PCB to meet two specifications may increase the failure rate, reducing yield. Accordingly, there is a need for a memory module that includes an improved mechanism for matching the impedance of the loaded portion of a signal trace with the impedance of the unloaded portion of that trace. There is a need for a memory module that maintains a uniform width for the trace as it is routed across the memory module, while still ensuring the impedance match.

SUMMARY OF THE INVENTION

A memory module is described. That memory module comprises a signal trace, which includes an unloaded portion and a loaded portion, and a memory device. The loaded portion has a first section and a second section, and the memory device has an input connection and an output connection. The first section of the loaded portion of the signal trace is coupled to the memory device's input connection and the second section of the loaded portion of the signal trace is coupled to the memory device's output connection. The impedance of the loaded portion is higher than it would have been if the first and second sections had been coupled to the same memory device connection.

In the following description, numerous specific details are set forth such as component types, dimensions, etc., to provide a thorough understanding of the present invention. However, it will be apparent to those skilled in the art that the invention may be practiced in many ways other than those expressly described here. The invention is thus not limited by the specific details disclosed below.

DETAILED DESCRIPTION OF THE INVENTION

Figure 1:
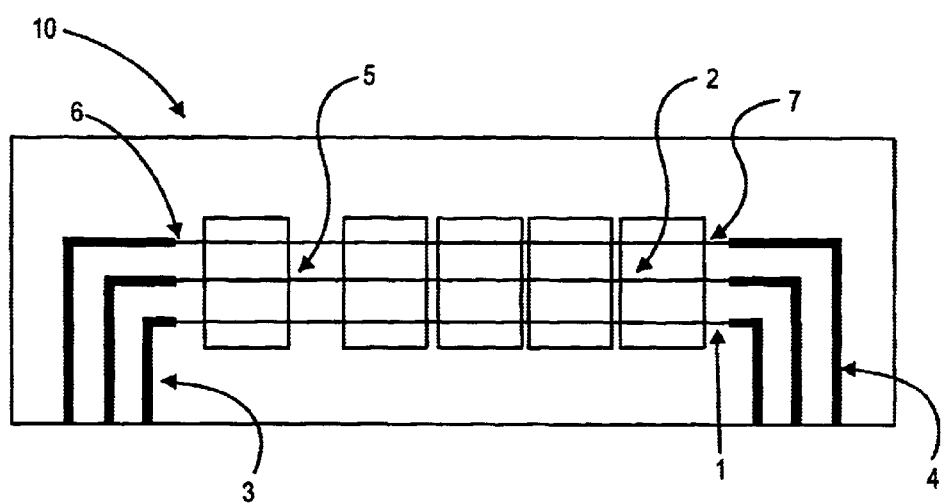
FIG. 1 illustrates a side view of a PCB that contains a number of memory devices.

As explained above, PCB 10 requires two specifications for trace width, which may increase cost, increase testing requirements, and reduce yield. It is thus desirable to replace the traces shown in FIG. 1, which include both thin sections and thick sections, with a trace that has a uniform width—while maintaining a close match between the impedance of the unloaded and loaded portions of the trace. To do so, the memory module of the present invention raises the average impedance of the loaded portion of the channel by modifying the memory device package, instead of by modifying the width of the traces that pass through the memory devices.

Figure 2A:
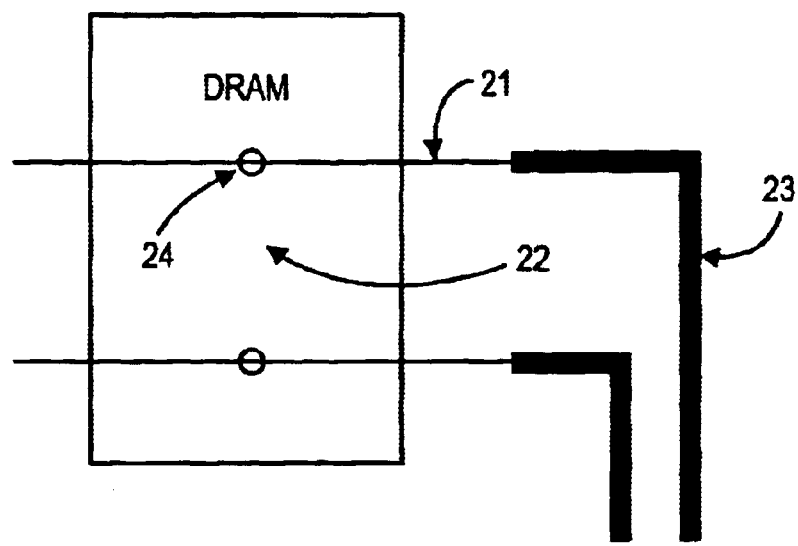
FIG. 2A represents an enlarged view of a section of the PCB of FIG. 1.
Figure 2B:
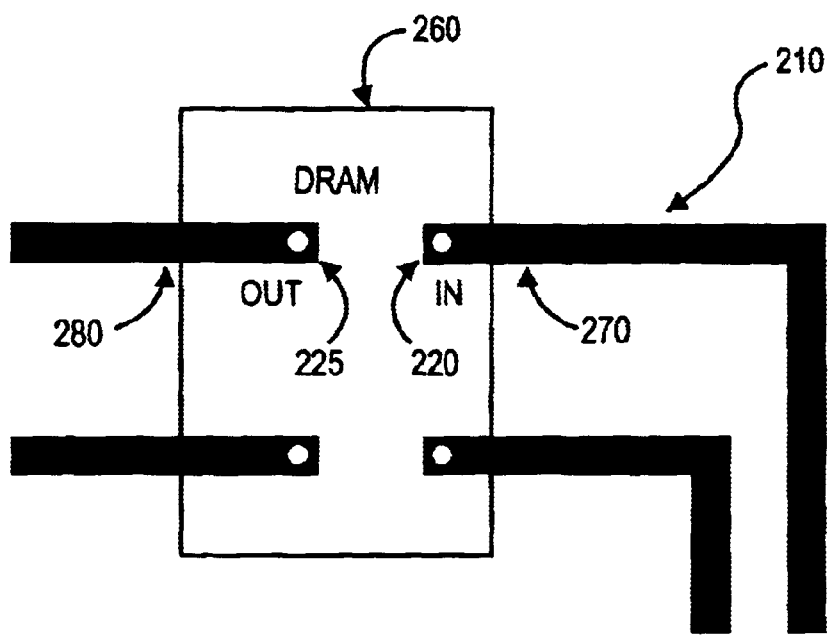
FIG. 2B illustrates an embodiment of the present invention as may be implemented in a memory card that contains a number of memory devices.

Compare the prior art model, illustrated in FIG. 2A, with an embodiment of the present invention, as illustrated in FIG. 2B. In FIG. 2A, relatively thin trace 21 is positioned between memory device 22 and relatively thick trace 23. Memory device 22 includes a single connection 24 that serves as both the input and output connection for the signal line. Although enabling a close impedance match between loaded and unloaded portions of the signal line, this arrangement causes the package inductance to be in series with device 22's capacitance, which may adversely affect signal integrity. (The package inductance results from a connecting member (not shown) that couples connection 24 to a bonding pad (not shown), which is formed on the die that is enclosed within the memory device.)

In contrast, the memory card of the present invention maintains a uniform width for trace 210, while increasing inductance by modifying memory device 260's package. Memory device 260, unlike memory device 22, includes input connection 220 and output connection 225. First section 270 of trace 210 is coupled to input connection 220 and second section 280 of trace 210 is coupled to output connection 225. Replacing single connection 24 with separate input and output connections 220 and 225 increases the inductance for the signal line as it passes through memory device 260. That, in turn, raises the average signal line impedance of the loaded portion of the channel. As a consequence, this modification to the memory device package enables the impedance of the loaded portion of the channel to closely match the impedance of the unloaded portion of the channel, without having to vary the width of trace 210.

Memory device 260 preferably is a dynamic random access memory ("DRAM") that includes—like all DRAMs—a die and a bond pad coupled to the die. Unlike other DRAMs, however, DRAM 260 includes a first connecting member (not shown) that couples the bond pad to input connection 220 and a second connecting member (not shown) that couples the bond pad to output connection 225. These first and second connecting members may, for example, be inductive traces like those used to connect bond pads to package balls in uBGA packaged devices. Note that in this embodiment of the present invention, the first connecting member couples input connection 220 to the same bond pad that is coupled to output connection 225 by the second connecting member. The first and second connecting members preferably provide substantially the same inductance to the signal line.

The degree to which replacing a single connection with input and output connections 220 and 225 will increase the impedance of the signal line at memory device 260 may depend upon various factors, as will be apparent to those skilled in the art of semiconductor packaging. In a preferred embodiment, materials and configurations are chosen for connections 220 and 225, and for their respective connecting members, such that the increased inductance balances the capacitance that memory device 260 adds. By balancing package inductance with memory device capacitance, the impedance of the loaded portion of the signal line may closely match the impedance of the unloaded portion. That impedance is preferably at least about 28 ohms.

A second memory device (not shown) may be coupled to memory device 260 by second section 280 of signal trace 210. Because memory device 260's package raises the inductance of the signal line, which raises impedance, sections 270 and 280 may have the same width as other parts of the signal trace, while a close impedance match between the loaded and unloaded portions of the signal line is maintained. That width is preferably between about 0.012 and about 0.016 inches. Another benefit of the memory module of the present invention may result from not positioning the package inductance in series with the memory device's capacitance, which could enhance signal integrity.

An improved memory module has been described. That memory module enables a loaded portion of a signal line to have increased impedance, which enables a close match between the impedance of loaded and unloaded portions. That impedance match results from using inductive traces that are included in the memory device package to increase the inductance of the loaded portion of the signal line, instead of by modifying the width of the trace formed on the PCB. Although the present invention has been described in the context of a memory card that contains several memory devices, the present invention may be implemented in other types of memory modules, e.g., those in which memory devices are mounted directly to a computer motherboard. Although the Direct Rambus memory channel is identified as potentially benefiting from use of the memory module of the present invention, this memory module may be used with other types of memory channels that are capable of transmitting high speed, pipelined signals.

Features shown in the above referenced drawings are not intended to be drawn to scale, nor are they intended to be shown in precise positional relationship. Additional features that may be used with the above described memory module have been omitted as they are not useful to explain aspects of the present invention. Although the foregoing description has specified an memory module that includes certain features, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A memory module comprising:
   a signal trace that includes an unloaded portion and a loaded portion, the loaded portion having a first section and a second section; and
   a memory device that includes an input connection and an output connection, the first section being coupled to the input connection and the second section being coupled to the output connection,
   wherein the impedance of the loaded portion is higher than it would have been if the first and second sections had been coupled to the same memory device connection.

2. The memory module of claim 1 wherein the unloaded and loaded portions of the signal trace have substantially the same width.

3. The memory module of claim 2 wherein the unloaded and loaded portions of the signal trace are each between about 0.012 and about 0.016 inches wide.

4. The memory module of claim 3 wherein the memory device further comprises a bond pad coupled to a die, a first connecting member that couples the bond pad to the input connection, and a second connecting member that couples the bond pad to the output connection.

5. The memory module of claim 4 wherein the first and second connecting members are inductive traces that provide substantially the same inductance.

6. The memory module of claim 5 wherein the inductance of the first and second connecting members ensures that the impedance of the loaded portion of the signal trace closely matches the impedance of the unloaded portion of the signal trace.

7. The memory module of claim 6 wherein the impedance of the unloaded portions of the signal trace and the impedance of the loaded portions of the signal trace are each at least about 28 ohms.

8. A dynamic random access memory comprising:
   a die;
   a bond pad coupled to the die;
   a first connecting member that couples the bond pad to an input connection;
   a second connecting member that couples the bond pad to an output connection;
   an input connection for receiving a first section of a signal trace; and an output connection for receiving a second section of the signal trace.

9. The dynamic random access memory of claim 8 wherein the inductance of the first and second connecting members ensures that the impedance of a loaded portion of the signal trace closely matches the impedance of an unloaded portion of the signal trace.

10. A memory card comprising:
   a signal trace that includes an unloaded portion and a loaded portion, the loaded portion having a first section and a second section; and
   a dynamic random access memory, which is mounted to the memory card, that comprises:
      a die;
      a bond pad coupled to the die;
      a first connecting member that couples the bond pad to an input connection, which is coupled to the first section of the signal trace; and
      a second connecting member that couples the bond pad to an output connection, which is coupled to the second section of the signal trace.

11. The memory card of claim 10 wherein the unloaded and loaded portions of the signal trace have substantially the same width.

12. The memory card of claim 11 wherein the unloaded and loaded portions of the signal trace are each between about 0.012 and about 0.016 inches wide.

13. The memory card of claim 12 wherein the first and second connecting members are inductive traces that have substantially the same inductance.

14. The memory card of claim 13 wherein the inductance of the first and second connecting members ensures that the impedance of the loaded portion of the signal trace closely matches the impedance of the unloaded portion of the signal trace.

15. The memory module of claim 14 wherein the impedance of the unloaded portions of the signal trace and the impedance of the loaded portions of the signal trace are each at least about 28 ohms.

* * * * *